(12) United States Patent
Horiuchi et al.

(10) Patent No.: US 9,960,165 B2
(45) Date of Patent: May 1, 2018

(54) SEMICONDUCTOR DEVICE HAVING ADJACENT IGBT AND DIODE REGIONS WITH A SHIFTED BOUNDARY PLANE BETWEEN A COLLECTOR REGION AND A CATHODE REGION

(71) Applicants: Yuki Horiuchi, Toyota (JP); Satoru Kameyama, Toyota (JP)

(72) Inventors: Yuki Horiuchi, Toyota (JP); Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days. days.

(21) Appl. No.: 15/027,846

(22) PCT Filed: Nov. 5, 2013

(86) PCT No.: PCT/JP2013/079895
§ 371 (c)(1),
(2) Date: Apr. 7, 2016

(87) PCT Pub. No.: WO2015/068203
PCT Pub. Date: May 14, 2015

(65) Prior Publication Data
US 2016/0247808 A1    Aug. 25, 2016

(51) Int. Cl.
*H01L 29/66*    (2006.01)
*H01L 27/105*    (2006.01)
(Continued)

(52) U.S. Cl.
CPC ........ *H01L 27/105* (2013.01); *H01L 29/0696* (2013.01); *H01L 29/0821* (2013.01);
(Continued)

(58) Field of Classification Search
CPC ......... H01L 29/66325; H01L 29/66333; H01L 29/6634; H01L 29/66348; H01L 29/7393; H01L 29/7395
See application file for complete search history.

(56) References Cited

U.S. PATENT DOCUMENTS

2002/0153586 A1    10/2002    Majumdar et al.
2008/0048295 A1    2/2008    Takahashi
(Continued)

FOREIGN PATENT DOCUMENTS

CN    101764139 A    6/2010
JP    H07-153942 A    6/1995
(Continued)

*Primary Examiner* — Phat X Cao
(74) *Attorney, Agent, or Firm* — Oliff PLC

(57) ABSTRACT

Provided is a technology for further reducing a loss in a semiconductor device including a semiconductor substrate in which an IGBT region and a diode region are provided. This semiconductor device includes a semiconductor substrate in which at least one IGBT region and at least one diode region are provided. The IGBT region and the diode region are adjacent to each other in a predetermined direction in a plan view of the semiconductor substrate. In the plan view of the semiconductor substrate, a first boundary plane where the collector region and the cathode region are adjacent is shifted from a second boundary plane where the IGBT region and the diode region are adjacent on the front surface side of the semiconductor substrate either in a direction from the cathode region toward the collector region or in a direction from the collector region toward the cathode region.

4 Claims, 8 Drawing Sheets

(51) Int. Cl.
  *H01L 29/78* (2006.01)
  *H01L 29/40* (2006.01)
  *H01L 29/739* (2006.01)
  *H01L 29/06* (2006.01)
  *H01L 29/08* (2006.01)

(52) U.S. Cl.
  CPC ........ *H01L 29/0839* (2013.01); *H01L 29/407* (2013.01); *H01L 29/7391* (2013.01); *H01L 29/7397* (2013.01); *H01L 29/78* (2013.01); *H01L 29/0834* (2013.01)

(56) References Cited

U.S. PATENT DOCUMENTS

| | | |
|---|---|---|
| 2010/0156506 A1 | 6/2010 | Tsuzuki et al. |
| 2011/0193132 A1* | 8/2011 | Kouno ................ H01L 29/0619 257/139 |
| 2011/0285427 A1 | 11/2011 | Koyama et al. |
| 2012/0043581 A1 | 2/2012 | Koyama et al. |
| 2012/0181575 A1 | 7/2012 | Pfirsch |
| 2014/0084335 A1 | 3/2014 | Senoo et al. |

FOREIGN PATENT DOCUMENTS

| | | |
|---|---|---|
| JP | 2002-314082 A | 10/2002 |
| JP | 2008-053648 A | 3/2008 |
| JP | 2010-135646 A | 6/2010 |
| JP | 2012-043890 A | 3/2012 |
| JP | 2012-151470 A | 8/2012 |
| WO | 2011/001588 A1 | 1/2011 |
| WO | 2012/169053 A1 | 12/2012 |

\* cited by examiner

SEMICONDUCTOR DEVICE HAVING ADJACENT IGBT AND DIODE REGIONS WITH A SHIFTED BOUNDARY PLANE BETWEEN A COLLECTOR REGION AND A CATHODE REGION

TECHNICAL FIELD

The technology disclosed herein relates to a semiconductor device.

BACKGROUND ART

Japanese Patent Application Publication No. 2008-053648 discloses a semiconductor device (a so-called RC-IGBT) including one semiconductor substrate in which a plurality of IGBT regions and a plurality of diode regions are provided. In each of the IGBT regions, a front surface structure of an IGBT is provided on a front surface side of the semiconductor substrate, and a collector region is provided on a back surface side of the semiconductor substrate. In each of the diode regions, a front surface structure of a diode is provided on the front surface side of the semiconductor substrate, and a cathode region is provided on the back surface side of the semiconductor substrate. The IGBT regions and the diode regions are alternately adjacent to each other in a predetermined direction. In a plan view of this semiconductor substrate, each boundary plane between the front surface structure of the IGBT and the front surface structure of the diode is in the same position as each boundary plane between the collector region and the cathode region.

SUMMARY

Technical Problem

In general, a semiconductor device including one semiconductor substrate in which an IGBT and a diode are provided has a problem with mutual interference between the IGBT and the diode. That is, an increase in on-voltage (hereinafter also referred to as "Von") of the IGBT due to the diode and/or an increase in forward voltage (hereinafter also referred to as "Vf") of the diode due to the IGBT causes an increase in loss of the semiconductor device.

In the aforementioned semiconductor device, the IGBT regions and the diode regions are provided such that in the plan view of the semiconductor substrate, the boundary plane between the front surface structure of the IGBT and the front surface structure of the diode is in the same position as the boundary plane between the collector region and the cathode region. This is considered to make it possible to suppress the increases in Von of the IGBT and Vf of the diode. However, such a structure of the semiconductor device cannot be said to be sufficient to suppress the increases in Von and Vf. Under such circumstances, there has been a demand for a technology that can further reduce the loss.

The present disclosure provides a technology for further reducing a loss in a semiconductor device including a semiconductor substrate in which both an IGBT region and a diode region are provided.

Solution to Technical Problem

A semiconductor device disclosed herein comprises a semiconductor substrate in which at least one IGBT region and at least one diode region are provided. The IGBT region comprises a first conductivity type emitter region disposed in an area exposed on a front surface of the semiconductor substrate, a second conductivity type base region surrounding the emitter region and in contact with the emitter region, a first conductivity type first drift region disposed on a back surface side of the semiconductor substrate with respect to the base region, and being separated from the emitter region by the base region, a gate electrode disposed in a trench penetrating the base region to extend to the first drift region, and facing a part of the base region which separates the emitter region from the first drift region, an insulating body disposed between the gate electrode and an inner wall of the trench, and a second conductivity type collector region disposed in an area exposed on a back surface of the semiconductor substrate. The diode region comprises a second conductivity type anode region disposed in an area exposed on the front surface of the semiconductor substrate, a first conductivity type second drift region disposed on the back surface side of the semiconductor substrate with respect to the anode region, and a first conductivity type cathode region disposed in an area exposed on the back surface of the semiconductor substrate. The IGBT region and the diode region are adjacent to each other in a plan view of the semiconductor substrate. In the plan view of the semiconductor substrate, a first boundary plane where the collector region and the cathode region are adjacent is shifted from a second boundary plane where the IGBT region and the diode region are adjacent on the front surface side of the semiconductor substrate either in a direction from the cathode region toward the collector region or in a direction from the collector region toward the cathode region.

In this semiconductor device, the first boundary plane and the second boundary plane are not located in the same position in the plan view of the semiconductor substrate. This configuration makes it possible to place the first boundary plane and the second boundary plane in such positions that the mutual interference between the IGBT and the diode can be appropriately suppressed, thus making it possible to more appropriately reduce a sum of losses due to Von and Vf as compared with a configuration in which the first boundary plane and the second boundary plane are located in the same position in the plan view of the semiconductor substrate. This makes it possible to further reduce a loss in a semiconductor device including a semiconductor substrate in which both an IGBT region and a diode region are provided.

DESCRIPTION OF EMBODIMENTS

Figure 1:
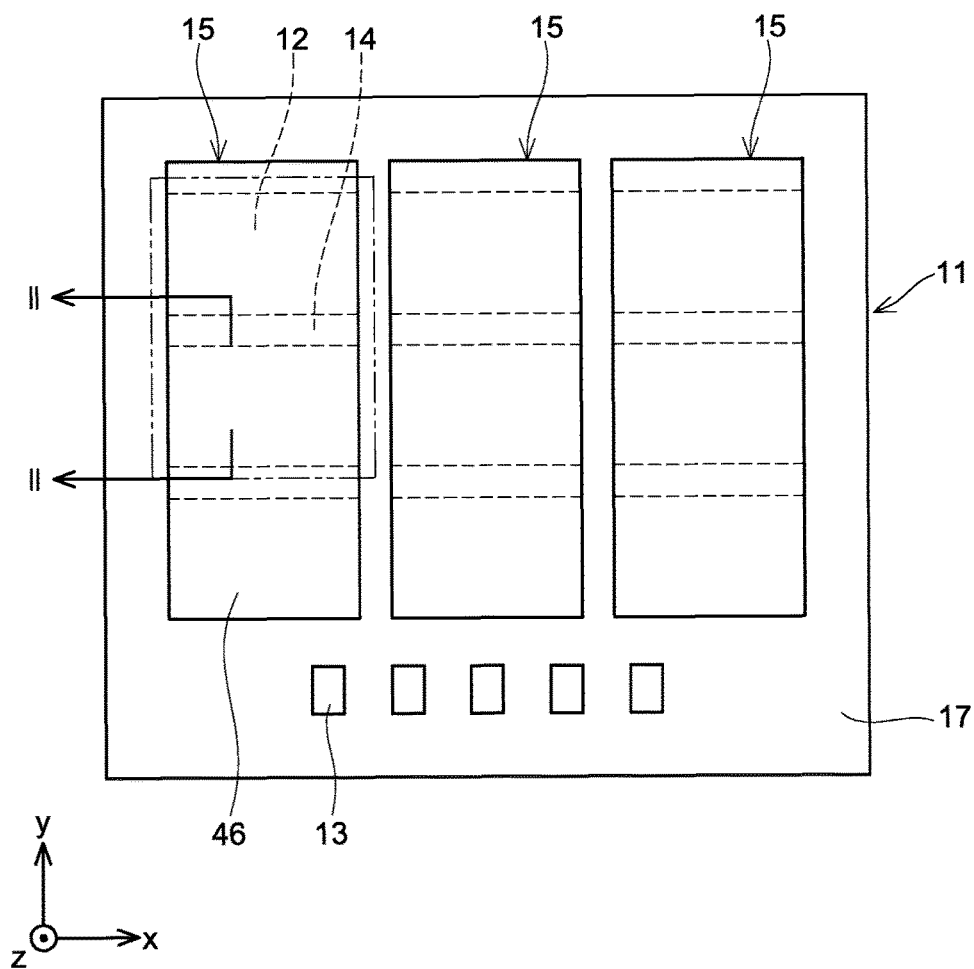
FIG. 1 is a plan view of a semiconductor device according to a First Embodiment.

Some of main features of embodiments will be listed below. It should be noted that technical features described below are independent from each other, and may technically be useful alone or in various combinations, and are not limited to the combinations as originally claimed.

In a semiconductor device disclosed herein, in the plan view of the semiconductor substrate, when an area of the IGBT region is larger than an area of the diode region, the first boundary plane may be shifted from the second boundary plane in a direction from the cathode region toward the collector region. Moreover, in the plan view of the semiconductor substrate, when the area of the diode region is larger than the area of the IGBT region, the first boundary plane may be shifted from the second boundary plane in a direction from the collector region toward the cathode region. In the following description, the term "IGBT region" refers to an area where a front surface structure of an IGBT is provided on a front surface side of the semiconductor substrate in the plan view of the semiconductor substrate. Similarly, the term "diode region" refers to an area where a front surface structure of a diode is provided on the front surface side of the semiconductor substrate in the plan view of the semiconductor substrate. In the aforementioned semiconductor device, the first boundary plane is located within the IGBT region when the area of the IGBT region is larger than the area of the diode region in the plan view of the semiconductor substrate. That is, in the plan view of the semiconductor substrate, an area of the cathode region is larger than the area of the diode region. This configuration reduces the interference of the IGBT with the diode on a boundary plane between the IGBT and the diode, thus decreasing Vf. At this occasion, Von increases on the contrary, but since an amount of decrease in Vf exceeds an amount of increase in Von, both Von and Vf can be appropriately reduced as a result. On the other hand, the first boundary plane is located within the diode region when the area of the diode region is larger than the area of the IGBT region in the plan view of the semiconductor substrate. That is, in the plan view of the semiconductor substrate, an area of the collector region is larger than the area of the IGBT region. This configuration reduces the interference of the diode with the IGBT on the boundary plane between the IGBT and the diode, thus decreasing Von. At this occasion, Vf increases on the contrary, but since an amount of decrease in Von exceeds an amount of increase in Vf, the sum of losses due to Von and Vf can be appropriately reduced as a result.

In the semiconductor device disclosed herein, in the plan view of the semiconductor substrate, the IGBT region and the diode region may have rectangular shapes. The IGBT region and the diode region may be adjacent to each other in a predetermined direction. The first boundary plane and the second boundary plane may extend in a direction perpendicular to the predetermined direction. When a width of the IGBT region in the predetermined direction is wider than a width of the diode region in the predetermined direction, the first boundary plane may be shifted from the second boundary plane in the direction from the cathode region toward the collector region by a first predetermined width. When the width of the diode region in the predetermined direction is wider than the width of the IGBT region in the predetermined direction, the first boundary plane may be shifted from the second boundary plane in the direction from the collector region toward the cathode region by a second predetermined width. This configuration makes it possible to more appropriately reduce the sum of losses due to Von and Vf, as compared with a configuration in which the first boundary plane is located in the same position as the second boundary plane in the plan view of the semiconductor substrate.

In the semiconductor device disclosed herein, in the plan view of the semiconductor substrate, the IGBT region and the diode region may have rectangular shapes. The IGBT region and the diode region may be adjacent to each other in a predetermined direction. The first boundary plane and the second boundary plane may extend in a direction perpendicular to the predetermined direction. When a width of the IGBT region in the predetermined direction is equal to a width of the diode region in the predetermined direction, the first boundary plane may be shifted from the second boundary plane in the direction from the collector region toward the cathode region by a third predetermined width. In general, when the width of the IGBT region in the predetermined direction and the width of the diode region in the predetermined direction are equal, Von is higher than Vf. For this reason, this configuration reduces the interference of the diode with the IGBT on the boundary plane between the IGBT and the diode, thus decreasing Von. At this occasion, Vf increases on the contrary, but since the amount of decrease hi Von exceeds the amount of increase in Vf, the sum of losses due to Von and Vf can be appropriately reduced as a result.

In the semiconductor device disclosed herein, the IGBT region and the diode region may be adjacent to each other in a predetermined direction. When a ratio of a width of the IGBT region to a width of the diode region in the predetermined direction is 3 to 1, the first boundary plane may be shifted from the second boundary plane in the direction from the cathode region toward the collector region by a length of 3 to 30% of the width of the diode region. Appropriate setting of the width of the diode region allows the semiconductor device to achieve the smallest sum of losses due to Von and Vf.

First Embodiment

A semiconductor device 10 according to the First Embodiment will be described. In a semiconductor substrate 11, element regions 15 and a non-element region 17 surrounding the element regions 15 are provided. The following will describe the element regions 15 but omit to describe the non-element region 17, which is a publicly-known component. In this embodiment, the semiconductor substrate 11 is a Si substrate. However, the semiconductor substrate 11 is not limited to a Si substrate. The semiconductor substrate 11 may be a substrate made of another material (e.g., a SiC substrate).

As shown in FIG. 1, three element regions 15 are provided in the semiconductor substrate 11. In the First Embodiment, the three element regions 15 have a same configuration as each other. However, not being limited to this, the element regions 15 may have respective element structures that are different from each other. An emitter electrode 46 is provided on a front surface of each of the element regions 15. Three IGBT regions 12 and three diode regions 14 are provided in each of the element regions 15. In a plan view of the semiconductor substrate 11, the three IGBT regions 12 have rectangular shapes and are substantially equal in size to each other. Similarly, the three diode regions 14 have rectangular shapes and are substantially equal in size to each other. The IGBT regions 12 and the diode regions 14 are alternately adjacent to each other in a y direction. In the First Embodiment, the IGBT regions 12 and the diode regions 14 are provided such that a ratio of an area of each IGBT region 12 to an area of each diode region 14 in the plan view of the semiconductor substrate is 3 to 1. The IGBT regions 12 and the diode regions 14 are substantially equal in length in an x direction to each other. For this reason, a ratio of a width of each IGBT region 12 to a width of each diode region 14 in the y direction is 3 to 1. In the following description, the term "area of a region" refers to the area of that region in the plan view of the semiconductor substrate 11, and the term "width of a region" refers to the width of that region in the y direction, unless otherwise noted. The same applies to the other embodiments. Gate pads 13 are provided on the semiconductor substrate 11. The gate pads 13 are electrically connected to gate electrodes 16 (which will be described later) via gate wires (not illustrated). It should be noted that the y direction corresponds to one example of the "predetermined direction".

Next, the IGBT regions 12 and the diode regions 14 will be described with reference to FIG. 2. It should be noted that the term "IGBT region 12" in the First Embodiment refers to an area where a front surface structure of an IGBT is provided on a front surface side of the semiconductor substrate 11 in the plan view of the semiconductor substrate 11. Similarly, the term "diode region 14" refers to an area where a front surface structure of a diode is provided on the front surface side of the semiconductor substrate 11 in the plan view of the semiconductor substrate 11. Details will be described later.

First, each of the IGBT regions 12 will be described. The IGBT regions 12 includes $n^+$-type emitter regions 40 and $p^+$-type contact regions 38. The emitter regions 40 and the contact regions 38 are provided in regions exposed on the front surface of the semiconductor substrate 11. In the First Embodiment, each contact region 38 is provided in contact with a side surface of the corresponding emitter region 40. However, this does not imply any limitation. Each contact region 38 may be provided away from the corresponding emitter region 40.

A $p^-$-type base region 36 is provided on lower sides of the emitter regions 40 and the contact regions 38. The base region 36 has a lower impurity concentration than the contact regions 38. The base region 36 is in contact with lower surfaces of the emitter regions 40 and lower surfaces of the contact regions 38. For this reason, each emitter region 40 is surrounded by the base region 36 and the corresponding contact region 38. It should be noted that in a case where each contact region 38 is provided away from the corresponding emitter region 40, the base region 36 is exposed on the front surface of the semiconductor substrate 11 and also disposed between the emitter region 40 and the contact region 38. That is, the base region 36 is also in contact with side surfaces of the emitter regions 40 and side surfaces of the contact regions 38.

An $n^-$-type drift region 32a is further provided on a lower side of the base region 36. Each drift region 32a is separated from the emitter regions 40 and the contact regions 38 by the base region 36. The drift region 32a has a lower impurity concentration than the emitter regions 40. The drift region 32a corresponds to one example of the "first drift region".

The IGBT region 12 includes gate trenches 24 in the semiconductor substrate 11 that extend in the x direction. Each of the gate trenches 24 penetrates the corresponding emitter region 40 and the base region 36 from the front surface of the semiconductor substrate 11 and has a lower end that extends to the drift region 32a. Gate electrodes 16 are each provided in a corresponding gate trench 24. Each of the gate electrodes 16 is provided such that a lower end thereof is slightly deeper than a lower surface of the base region 36. An insulating body 26 is filled between a wall surface of each gate trench 24 and the corresponding gate electrode 16 (i.e., lateral to and below the gate electrode 16). For this reason, each gate electrode 16 faces the base region 36 and the corresponding emitter region 40 via the corresponding insulating body 26. However, as shown in FIG. 2, the gate electrodes 16 include a type of gate electrodes 16 each of which faces the base region 36 and the emitter region 40 via the insulating body 26 on both side surfaces of that gate electrode 16, and a type of gate electrodes 16 each of which faces the base region 36 and the emitter region 40 via the insulating body 26 only on one side surface of that gate electrode 16. In the following description, each of the gate trenches 24 in which the latter type of gate electrodes 16 is provided is referred to as an "edge gate trench 24a" in particular. Cap insulating films 45 are each provided on a front surface of the corresponding gate electrode 16. For the insulating bodies 26, for example $SiO_2$, $SiN$, or $Al_2O_3$ may be implemented, but may not be limited to these.

The emitter regions 40, the contact regions 38, the base region 36, the gate trenches 24 (including the edge gate trenches 24a (which will be described later)), the gate electrodes 16, and the insulating bodies 26 form the front surface structure of each IGBT. Strictly speaking, each of end faces of the front surface structure of the IGBT on a y direction side is located at a center of each edge gate trench 24a in a width direction (y direction). Dashed lines B are lines along which the semiconductor substrate 11 is cut in a z direction in the centers of the edge gate trenches 24a in the y direction. That is, the dashed lines B are lines that extend along the end faces of the front surface structure of each IGBT on the y direction side. Among regions demarcated by the dashed lines B, each of regions that include the aforementioned emitter regions 40 is the IGBT region 12.

An n-type buffer region 30a is provided on a lower side of the drift region 32a. The buffer region 30a has a higher impurity concentration than the drift region 32a, and has a lower impurity concentration than the emitter regions 40. The buffer region 30a is separated from the base region 36 by the drift region 32a.

The IGBT region 12 includes a $p^+$-type collector region 42 provided in a central part thereof in the y direction and in an area exposed on a back surface of the semiconductor substrate 11. The collector region 42 has a higher impurity concentration than the base region 36. The collector region 42 is in contact with a lower surface of the buffer region 30a. The collector region 42 is separated from the drift region 32a by the buffer region 30a. Further, the IGBT region 12 includes n+-type cathode regions 44 (which will be described later) provided at both ends thereof in the y direction and in areas exposed on the back surface of the semiconductor substrate 11.

Next, each of the diode regions 14 will be described. In the diode region 14, $p^+$-type contact regions 50 are provided in regions exposed on the front surface of the semiconductor substrate 11. Further, a $p^-$-type anode region 60 is provided in a region exposed on the front surface of the semiconductor substrate 11. The anode region 60 has a lower impurity concentration than the contact regions 50. The anode region 60 is in contact with lateral side and lower surfaces of the contact regions 50 and surrounds the contact regions 50. The anode region 60 and the base region 36 may be either integrally formed in one step or separately formed.

An n⁻-type drift region 32b is provided on a lower side of the anode region 60. The drift region 32b is in contact with a lower surface of the anode region 60 and is separated from the contact regions 50 by the anode region 60. It should be noted that the drift region 32b is formed integrally with the drill region 32a of the IGBT region 12. Further, the drift regions 32a and 32b are provided entirely across each of the element regions 15 of the semiconductor substrate 11. In the following description, the drift region 32a and the drift region 32b may be collectively referred to as "drift region 32". It should be noted that the drift region 32b corresponds to one example of the "second drift region".

The diode region 14 includes a trench 54 in the semiconductor substrate 11 that extends in the x direction. The trench 54 penetrates the anode region 60 from the front surface of the semiconductor substrate 11 and has a lower end that extends to the drift region 32b. A conductive body 52 is provided in the trench 54. The conductive body 52 is provided such that a lower end thereof is slightly deeper than the lower surface of the anode region 60. An insulating body 56 is filled between a wall surface of the trench 54 and the conductive body 52 (i.e., lateral to and below the conductive body 52). In the First Embodiment, the trench 54, the conductive body 52, and the insulating body 56 are formed in a same step as the gate trenches 24, the gate electrodes 16, and the insulating bodies 26 of the IGBT region 12. However, this does not imply any limitation. The trench 54, the conductive body 52, and the insulating body 56 may be separately formed. Further, the conductive body 52 may not have to be provided.

The contact regions 50, the anode region 60, the trench 54, the conductive body 52, and the insulating body 56 form the front surface structure of each diode. Strictly speaking, each of end faces of the front surface structure of the diode on the y direction side is located at the center of each edge gate trench 24a in the width direction (y direction). That is, the dashed lines B can also be said to be lines that extend along the end faces of the front surface structure of each diode on the y direction side. Among the regions demarcated by the dashed lines B, each of regions that do not include the emitter regions 40 is the diode region 14.

An n-type buffer region 30b is provided on a lower side of the drift region 32b. The buffer region 30b has a higher impurity concentration than the drift region 32b. The buffer region 30b is separated from the anode region 60 by the drift region 32b. It should be noted that the buffer region 30b is formed integrally with the buffer region 30a of the IGBT region 12. Further, the buffer regions 30a and 30b are provided entirely across each of the element regions 15 of the semiconductor substrate 11.

The diode region 14 includes an n⁺-type cathode region 44 provided in an area exposed on the back surface of the semiconductor substrate 11. The cathode region 44 has a higher impurity concentration than the buffer region 30b. The cathode region 44 is in contact with a lower surface of the buffer region 30b. The cathode region 44 is separated from the drift region 32b by the buffer region 30b. Both ends of the cathode region 44 in the y direction are located in the corresponding IGBT regions 12. That is, the cathode region 44 is provided not only in the diode region 14 but also in the IGBT regions 12.

The emitter electrodes 46 are provided on the front surface of the semiconductor substrate 11. Each of the emitter electrodes 46 is provided on a whole surface of the corresponding element region 15 of the semiconductor substrate 11. The emitter electrode 46 is in ohmic contact with the emitter regions 40, the contact regions 38, the contact regions 50, and the anode regions 60. The emitter electrode 46 is insulated from the gate electrodes 16 by the cap insulating films 45. Meanwhile, a collector electrode 28 is provided on the back surface of the semiconductor substrate 11. The collector electrode 28 is provided on a whole surface of the semiconductor substrate 11. The collector electrode 28 is in ohmic contact with the collector regions 42 and the cathode regions 44.

Next, a positional relationship between boundary planes (hereinafter referred to as "front surface side boundary planes 20") between a front surface structure of an IGBT and a front surface structure of a diode and boundary planes (hereinafter referred to as "back surface side boundary planes 22") between the collector region 42 and the cathode region 44 is described in detail with reference to FIGS. 2 and 3. For the ease of illustration, FIG. 3 omits to illustrate the collector electrode 28 provided on the back surface of the semiconductor substrate 11. It should be noted that the front surface side boundary planes 20 correspond to one example of the "second boundary plane" and the back surface side boundary planes 22 correspond to one example of the "first boundary plane".

Figure 2:
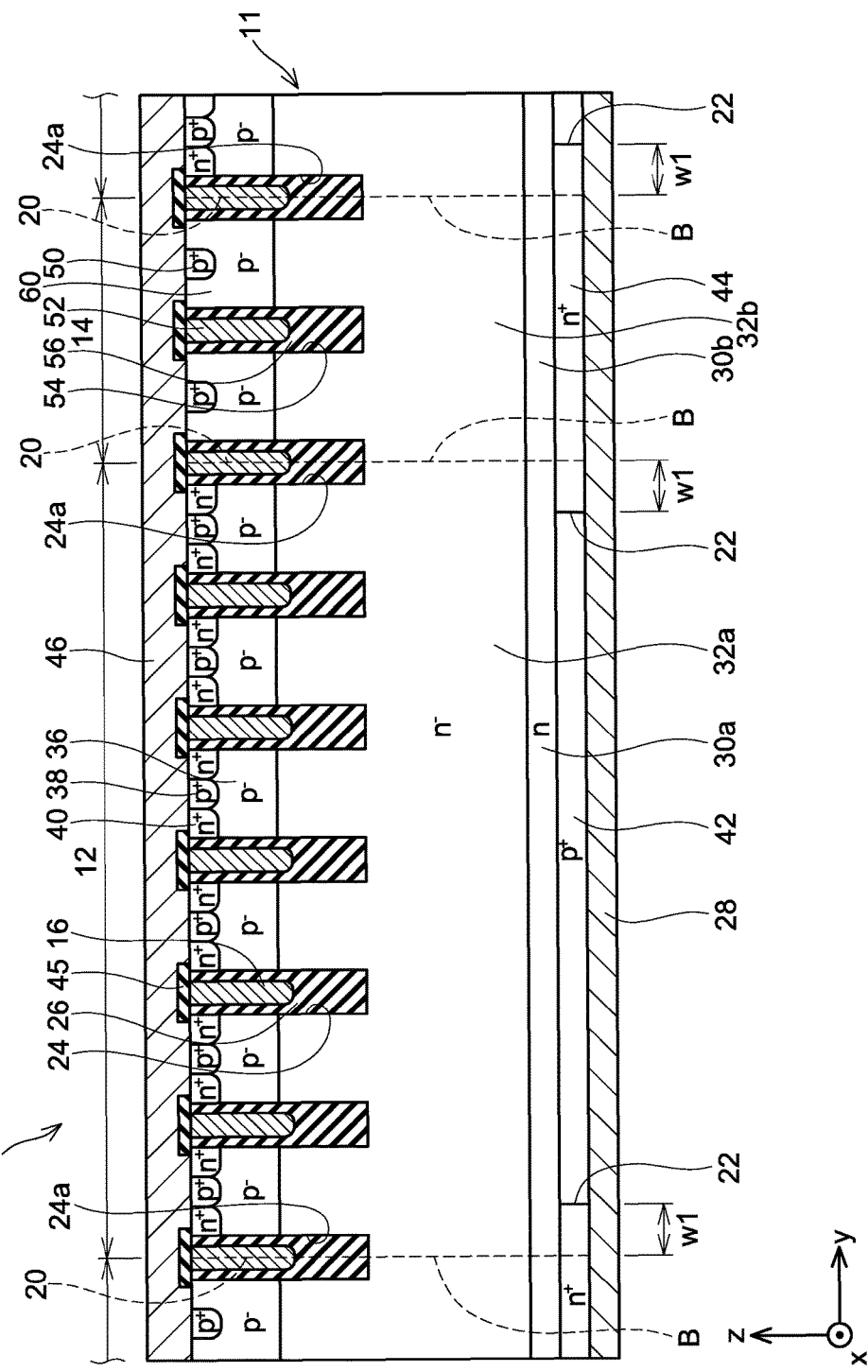
FIG. 2 is a longitudinal sectional view taken along line II-II in FIG. 1.
Figure 3:
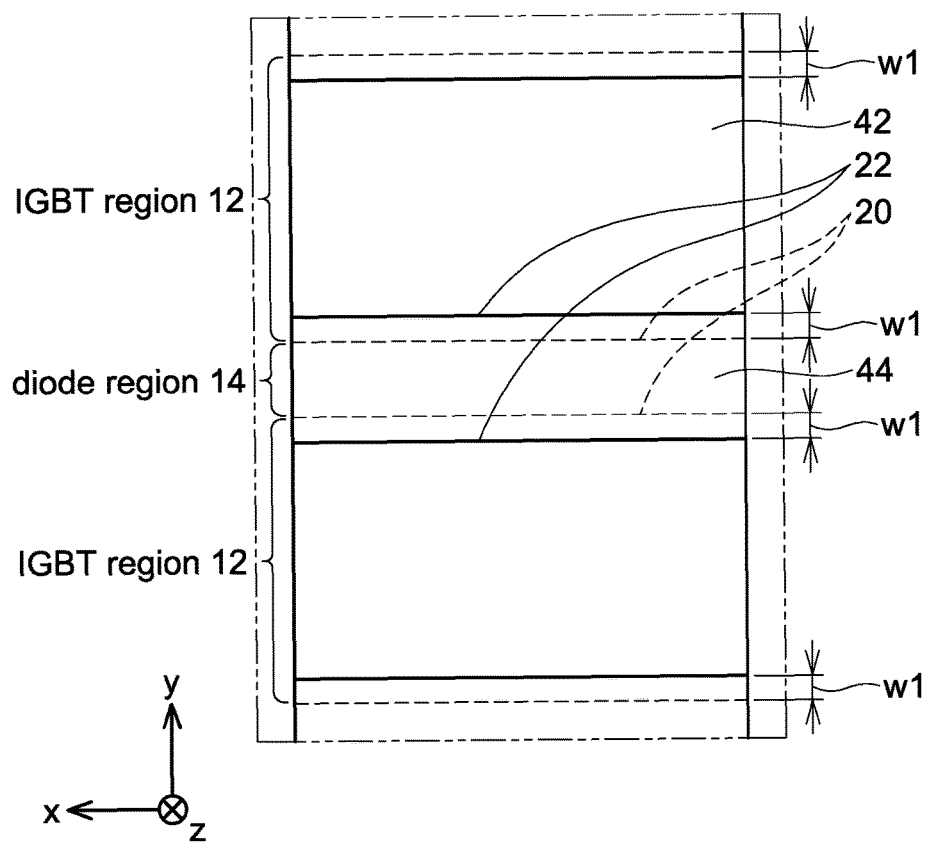
FIG. 3 is a partially enlarged view of a section on a back surface of a semiconductor substrate that is indicated by a two-dot chain line in FIG. 1.

Dashed lines 20 in FIGS. 2 and 3 indicate positions of the front surface side boundary planes 20 of the semiconductor substrate 11. As shown in FIG. 3, the front surface side boundary planes 20 and back surface side boundary planes 22 extend in the x direction. That is, the front surface side boundary planes 20 and the back surface side boundary planes 22 extend in a direction orthogonal to the direction (y direction) in Which the IGBT regions 12 and the diode regions 14 are provided alternately adjacent to each other.

In the First Embodiment, as mentioned above, the area of each IGBT region 12 is larger than the area of each diode region 14. In this case, each collector region 42 and each cathode region 44 are provided such that the back surface side boundary planes 22 are located within the regions 12 in the plan view of the semiconductor substrate 11. Specifically, the back surface side boundary planes 22 are shifted from the front surface side boundary planes 20 in directions from each cathode region 44 toward the corresponding collector regions 42 by a width w1 (i.e., in directions in which a width of the cathode region 44 is lengthened in the y direction). More specifically, the back surface side boundary plane 22 of a single cathode region 44 on a −y direction side is shifted on a −y direction side by a width w1 from the front surface side boundary plane 20 of a front surface structure of a diode on the −y direction side. Further, the back surface side boundary plane 22 of the single cathode region 44 on the y direction side is shifted on the y direction side by the width w1 from the front surface side boundary plane 20 of the front surface structure of the diode on the y direction side. Because of this, the width of each cathode region 44 is longer than a width of each diode region 14 by 2×w1. Conversely, a width of each collector region 42 is shorter than a width of each IGBT region 12 by 2×w1. As mentioned above, the respective regions are substantially equal in length in the x direction to each other. For this reason, the area of each cathode region 44 is larger than the area of each diode region 14 (i.e., an area of the front surface structure of the diode). Conversely, an area of each collector region 42 is smaller than an area of each IGBT region 12

(i.e., an area of the front surface structure of the IGBT). Because of this, a ratio of the area of each cathode region 44 to the area of each collector region 42 is larger than a ratio of the area of each diode region 14 to the area of each IGBT region 12. As is evident from the aforementioned configuration, it is needless to say that in the plan view of the semiconductor substrate 11, each diode region 14 is located within the corresponding cathode region 44 and each collector region 42 is located within the corresponding IGBT region 12. It should be noted that the width w1 corresponds to one example of the "first predetermined width".

Next, operation of IGBTs is described. First, the collector electrode 28 is connected to a power supply potential, and the emitter electrodes 46 are connected to a ground potential. In a case where a potential that is applied to the gate pads 13 is lower than a threshold potential, the semiconductor device 10 is off. Meanwhile, when the potential that is applied to the gate pads 13 becomes equal to or higher than the threshold potential, the semiconductor device 10 is turned on. That is, the potential applied to the gate pads 13 is applied to the gate electrodes 16 via the gate wires (not illustrated). When the potential that is applied to the gate electrodes 16 becomes equal to or higher than the threshold potential, a channel is formed in an area of the base regions 36 that is in contact with each insulating body 26. This causes electrons to flow from the emitter electrodes 46 to the collector electrode 28 through the emitter regions 40, the channel of the base regions 36, the drift regions 32a, the buffer regions 30a, and the collector regions 42. That is, current flows from an area of the collector electrode 28 where the collector regions 42 are provided to an area of the emitter electrodes 46 where the front surface structures of the IGBTs is provided. It Should be noted that the cathode regions 44 in the IGBT regions 12 do not function as an IGBT. That is, it should be noted that the First Embodiment draws a distinction between the IGBT regions 12 and IGBTs.

Next, operation of diodes is described. Application of a positive voltage to the emitter electrodes 46 turns on diodes formed by the anode regions 60 and the cathode regions 44. This causes a current to flow from an area of the emitter electrodes 46 where the front surface structures of the diodes are provided to areas of the collector electrode 28 where the cathode regions 44 are provided. In the First Embodiment, each cathode region 44 is provided not only in the diode region 14 but also in the IGBT regions 12. For this reason, each IGBT region 12 includes a region that functions as a diode. That is, it should be noted that the First Embodiment draws a distinction between the diode regions 14 and the diodes.

In a conventional semiconductor device (i.e., a semiconductor device in which the front surface side boundary planes 20 and the back surface side boundary planes 22 are in the same positions in the plan view of a semiconductor substrate 11), there is a significant amount of mutual interference on each boundary plane between an IGBT and a diode. The mutual interference is a phenomenon in which, in a case where an IGBT and a diode are provided adjacent to each other in one semiconductor substrate 11, Vf of the diode increases due to the presence of the IGBT and Von of the IGBT increases due to the presence of the diode. In the First Embodiment, the back surface side boundary planes 22 are shifted from the front surface side boundary planes 20 in the y directions (strictly speaking, in the ±y directions) by the width w1. This makes it possible to reduce a loss of the semiconductor device 10 caused by the mutual interference on the boundary planes.

In the First Embodiment, the area of each IGBT region 12 is larger than the area of each diode region 14. In this case, the back surface side boundary planes 22 are made to project from the front surface side boundary planes 20 in directions from each cathode region 44 toward the corresponding collector regions 42. This causes each cathode region 44 to be larger in area than in the conventional semiconductor device. This decreases a current density of a current that flows into the cathode regions 44 when the diode is turned on, thus making it possible to decrease Vf. That is, this makes it possible to reduce the interference of the IGBT with the diode. Note here that a sum of the areas of an IGBT region 12 and a diode region 14 is substantially equal to a sum of the areas of a collector region 42 and a cathode region 44. For this reason, when the area of each cathode region 44 becomes larger, the area of each collector region 42 becomes smaller by the increased amount accordingly. Because of this, the interference of the diode with the IGBT increases on the contrary, and Von becomes larger than it is in the conventional semiconductor device. However, in a case where the area of each IGBT region 12 is larger than the area of each diode region 14, the amount of decrease in loss caused by Vf due to the back surface side boundary planes 22 projecting in the aforementioned directions is larger than the amount of increase in loss caused by Von. This makes it possible to reduce the sum of the losses caused by Von and Vf and better reduce the loss of the semiconductor device than the conventional technology.

In particular, in the First Embodiment, the IGBT regions 12 and the diode regions 14 are substantially equal in length in the x direction to each other. For this reason, the ratio of the area of each IGBT region 12 to the area of each diode region 14 is equal to the ratio of the width of each IGBT region 12 to the width of each diode region 14 in the y direction. Further, in the First Embodiment, the back surface side boundary planes 22 and the front surface side boundary planes 20 are parallel to each other in the plan view of the semiconductor substrate 11. For this reason, each projecting width of the back surface side boundary planes 22 from the front surface side boundary planes 20 (hereinafter also referred to as "projecting width of the cathode region 44") remains constant along the x direction. Therefore, the interference of IGBT with the diode is reduced equally along the x direction.

Figure 4:
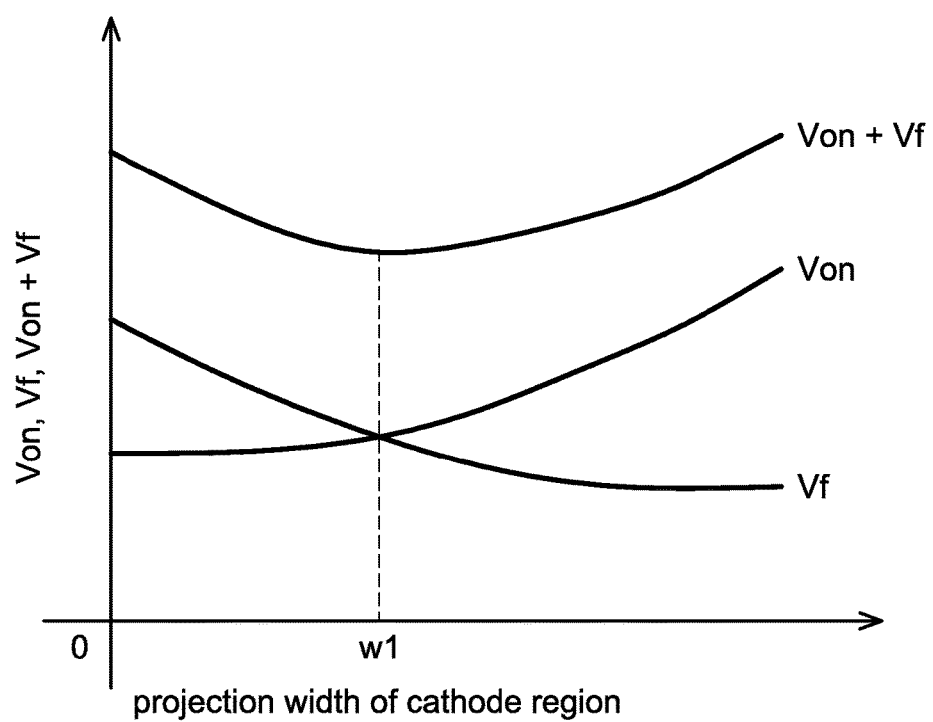
FIG. 4 is a graph schematically showing a relationship between a projecting width of a cathode region and a loss due to Von, a relationship between the projecting width and a loss due to Vf, and a relationship between the projecting width and a sum of losses due to Von and Vf.

A relationship between the projecting width of each cathode region 41 and a loss of the IGBT due to Von, a relationship between the projecting width and a loss of a diode due to Vf, and a relationship between the projecting width and the sum of the losses due to Von and Vf (i.e., a loss of the semiconductor device 10) will be described here with reference to a graph of FIG. 4. As shown in the graph, the loss due to Vf decreases as the projecting width of the cathode region 44 becomes larger. The amount of decrease in the loss due to Vf gradually becomes smaller and finally becomes saturated as the projecting width of the cathode region 44 becomes larger. Meanwhile, the loss due to Von exponentially increases as the projecting width of the cathode region 44 becomes larger. For this reason, the sum of the losses due to Von and Vf gradually decreases as the projecting width of the cathode region 44 becomes larger, and gradually increases upon exceeding a constant value w1. According to this graph, an appropriate projecting width w1 of the cathode region 44 can be obtained. A simulation result shows that in the First Embodiment, the sum of the losses due to Von and Vf is smallest when the cathode region 44 projects by a length of 12% of the width of the cathode region 44.

This constant value w1 varies depending on the ratio of the width of each IGBT region 12 to the width of each diode region 14. Further, even in a case where the ratio of the width of the region 12 to the width of the region 14 is constant, the constant value w1 varies depending on values of the areas of the regions 12 and 14. For example, in the First Embodiment, the ratio of the width of the region 12 to the width of the region 14 is 3 to 1. In this case, the constant value w1 is small when the widths of the regions 12 and 14 are comparatively wide. This can be explained as follows: That is, the mutual interference is a phenomenon that occurs on a boundary plane between an IGBT and a diode. For this reason, the IGBT is not affected by the diode in the central part of the IGBT region 12 in the y direction. Similarly, the diode is not affected by the IGBT in a central part of the diode region 14 in the y direction. Therefore, when the widths of the regions 12 and 14 are comparatively wide, the central parts of the regions 12 and 14 in the y direction become also wide, as a result of which more of the regions is free from interference from the diode or the IGBT. In this case, the smallest sum of losses due to Von and Vf is achieved by simply causing each cathode region 44 to project slightly.

On the other hand, in a case where the widths of the regions 12 and 14 are comparatively short, the central parts of the regions 12 and 14 in the y direction are also short, as a result of which less of the regions is free from the interference from the diode or the IGBT. In this example, the diode in particular is more subject to interference from the IGBT as the diode region 14 is smaller in width (i.e., smaller in area) than the IGBT region 12. For this reason, the smallest sum of losses due to Von and Vf cannot be achieved unless each cathode region 44 projects greatly to some degree.

The inventors of the present teachings conducted a simulation of calculating the constant value w1 based on ranges of values of the areas of each of the regions 12 and 14 that can be currently assumed. The results showed that in a case where the ratio of the width of the region 12 to the width of the region 14 is 3 to 1, the constant value w1 falls within a range of 3 to 30% of the width of the diode region 14. As is evident from the foregoing explanation, in a case where the areas of the regions 12 and 14 take on the largest values that can be currently assumed, the constant value w1 corresponds to a value of 3% of the width of the diode region 14. Moreover, in a case where the areas of the regions 12 and 14 take on the smallest values that can be currently assumed, the constant value w1 corresponds to a value of 30% of the width of the diode region 14. It should be noted that a proportion of the constant value w1 to the width of the diode region 14 preferably falls within a range of 4.8% to 12%. It should also be noted that the ratio of the width of the region 12 to the width of the region 14 is not limited to 3 to 1. For example, in a case where the ratio of the width of the region 12 to the width of the region 14 is 2 to 1, the constant value w1 falls within a range of 3 to 20% of the width of the diode region 14. Alternatively, in a case where the ratio of the width of the region 12 to the width of the region 14 is 4 to 1, the constant value w1 falls within a range of 3 to 40% of the width of the diode region 14. Alternatively, in a case where the ratio of the width of the region 12 to the width of the region 14 is 5 to 1, the constant value w1 falls within a range of 3 to 50% of the width of the diode region 14. It was found that a rate of reduction in the loss of the semiconductor device 10 due to the projection of the cathode region 44 is at most approximately 20%, although this varies depending, for example, on the ratio of the area of the region 12 to the area of the region 14, the values of the areas of the regions 12 and 14, and the thickness of the semiconductor substrate 11.

Further, the projection of each cathode region 44 in the direction from the cathode region 44 toward the corresponding collector regions 42 by a certain width can be achieved simply by changing mask aligners for separately making the collector regions 42 and the cathode regions 44. This makes it possible to easily reduce the loss of the semiconductor device 10 without changing manufacturing steps or increasing the number of steps.

Further, in general, a plurality of the IGBT regions 12 and a plurality of the diode regions 14 are dispersedly provided in each element region 15. This prevents either of the IGBT regions 12 or the diode regions 14 from being locally formed at a single point, thus making it possible to disperse heat-generating portions of the semiconductor device 10. However, the formation of the plurality of the IGBT regions 12 and the plurality of the diode regions 14 leads to an increase in a number of boundary planes between IGBTs and diodes. This poses a risk of an increase in the loss of the semiconductor device 10 due to the mutual interference in vicinity of the respective boundary planes. In the First Embodiment, the loss of the semiconductor device 10 caused by the mutual interference in the vicinity of the boundary planes is reduced by shifting the back surface side boundary planes 22 from the front surface side boundary planes 20 in the plan view of the semiconductor substrate 11. This makes it possible to reduce the loss of the semiconductor device 10 While dispersing the heat-generating portions of the semiconductor device 10.

Second Embodiment

Figure 5:
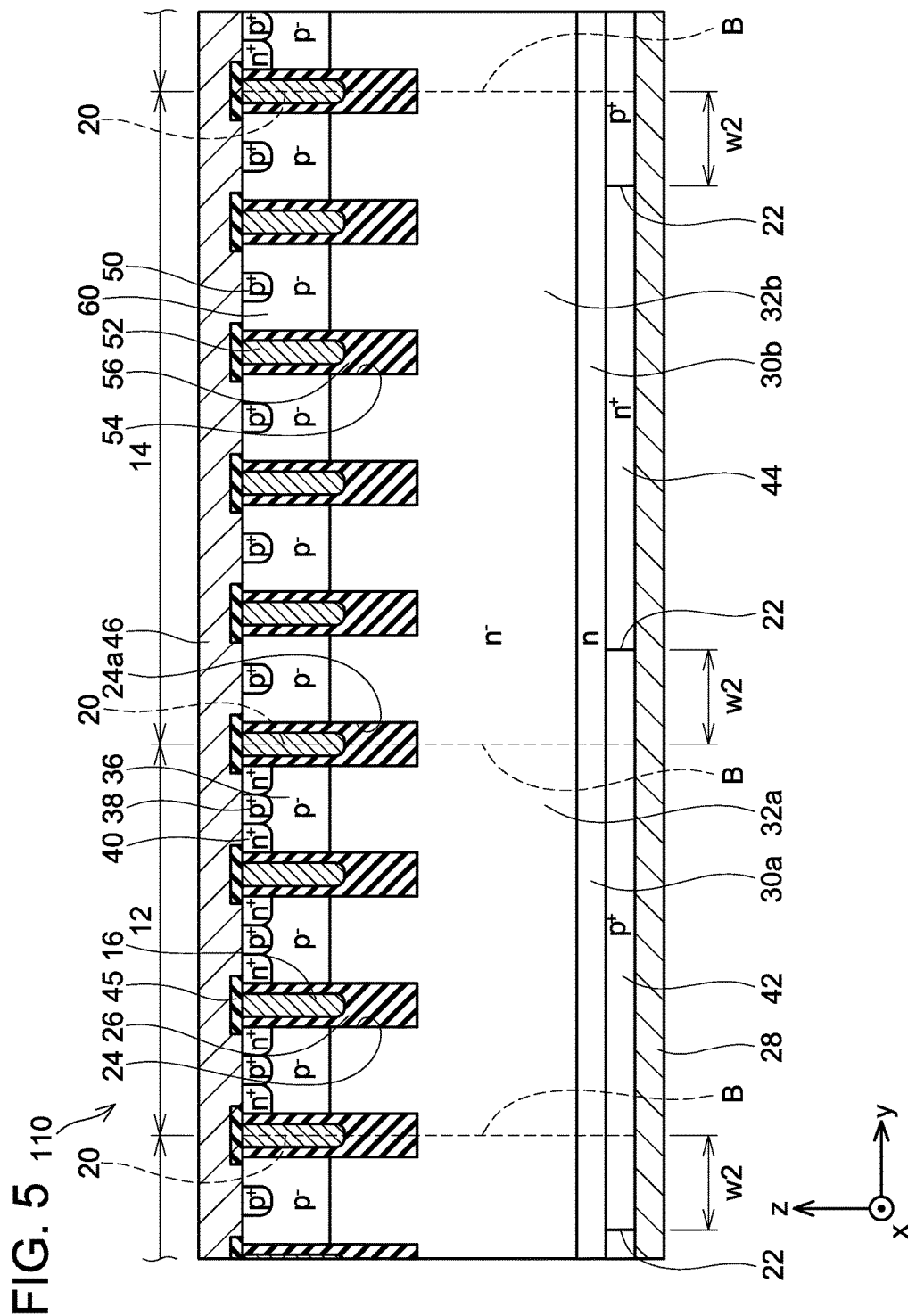
FIG. 5 is a longitudinal sectional view of a semiconductor device according to a Second Embodiment.
Figure 6:
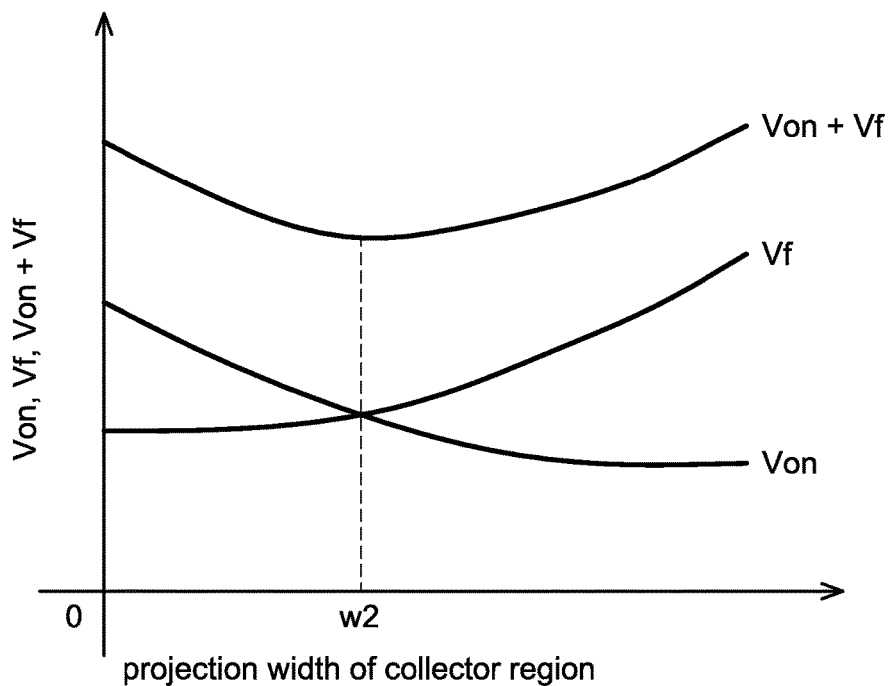
FIG. 6 is a graph schematically showing a relationship between a projecting width of a collector region and a loss due to Von, a relationship between the projecting width and a loss due to Vf, and a relationship between the projecting width and the sum of the losses due to Von and Vf.

Next, a Second Embodiment will be described with reference to FIGS. 5 and 6. In the following description, only points of difference from the First Embodiment will be described, and a detailed description of components identical to those of the First Embodiment will be omitted. The same applies to the other embodiments.

A semiconductor device 110 according to the Second Embodiment differs from the semiconductor device 10 according to the First Embodiment in that the width of each diode region 14 is wider than the width of each mar region 12 and that the back surface side boundary planes 22 are projected from the front surface side boundary planes 20 in directions from each collector region 42 toward the corresponding cathode regions 44 by a width w2. It should be noted that the width w2 corresponds to one example of the "second predetermined width".

As mentioned above, the cathode regions 44 and the drift region 32 are of the same conductivity type. This causes a short circuit between the drift region 32 and the collector electrode 28 in an area where each cathode region 44 is provided. Therefore, conventional semiconductor devices had such a problem that when each IGBT is in an on-state, electrons that are released from the emitter regions 40 in vicinity of the front surface side boundary planes 20 preferentially flow into the cathode regions 44 of the diode regions 14. That is, electrons having entered the drift regions 32a through the channel from the emitter regions 40 in the vicinity of the front surface side boundary planes 20 tended to flow into the cathode regions 44 beyond the boundary planes each between the IGBT and the diode instead of flowing into the collector regions 42 provided below the emitter regions 40. This makes a potential difference less likely to be generated between the collector regions 42 in vicinity of the back surface side boundary planes 22 and the buffer regions 30a, thus making it less likely that holes are implanted into the drift regions 32a. As a result, a snap-back phenomenon occurs in vicinity of the boundary planes each between the IGBT and the diode, and Von of the IGBTs increases (interference of the diode with the IGBT).

In the Second Embodiment, the width of each diode region 14 is longer than the width of each IGBT region 12. In this case, the back surface side boundary planes 22 are made to project from the front surface side boundary planes 20 in directions from each collector region 42 toward the corresponding cathode regions 44 by the width w2. The projection of each collector region 42 in the directions (y direction) crossing the direction (z direction) in which electrons normally flow disables electrons that are released from the emitter regions 40 to easily flow into the cathode regions 44. In other words, electrons that are released from the emitter regions 40 in the vicinity of the front surface side boundary planes 20 come to easily flow into the collector regions 42. This allows holes to be appropriately implanted from the collector regions 42 into the drift regions 32a, and conductivity modulation drastically lowers resistance of the drift regions 32a. As a result, Von can be decreased. That is, the interference of the diode with the IGBT can be reduced. At this occasion, when the width of each collector region 42 becomes longer, the width of each cathode region 44 becomes shorter accordingly by the increased amount (i.e., the area of the cathode region 44 becomes smaller). Because of this, the current density of a current that flows through the diodes increases, and Vf increases on the contrary. However, in a case where the width of each diode region 14 is larger than the width of each IGBT region 12, the amount of decrease in loss of Von due to the projection of the back surface side boundary planes 22 in the aforementioned direction is larger than the amount of increase in loss of Vf. This makes it possible to reduce the sum of the losses of Von and Vf, thus making it possible to reduce the loss of the semiconductor device.

A relationship between the projecting width of each collector region 42 and the loss due to Von, a relationship between the projecting width and the loss due to Vf, and a relationship between the projecting width and the sum of the losses due to Von and Vf will be described here with reference to a graph of FIG. 6. As shown in the graph, the loss due to Von decreases as the projecting width of the collector region 42 becomes larger. The amount of decrease in the loss due to Von gradually becomes smaller and finally becomes saturated as the projecting width of the collector region 42 becomes larger. Meanwhile, the loss due to Vf exponentially increases as the projecting width of the cathode region 44 becomes larger. For this reason, the sum of the losses due to Von and Vf gradually decreases as the projecting width of the collector region 42 becomes larger, and gradually increases upon exceeding a constant value w2. According to this graph, an appropriate projection width w2 of the collector region 42 can be calculated.

Third Embodiment

Figure 7:
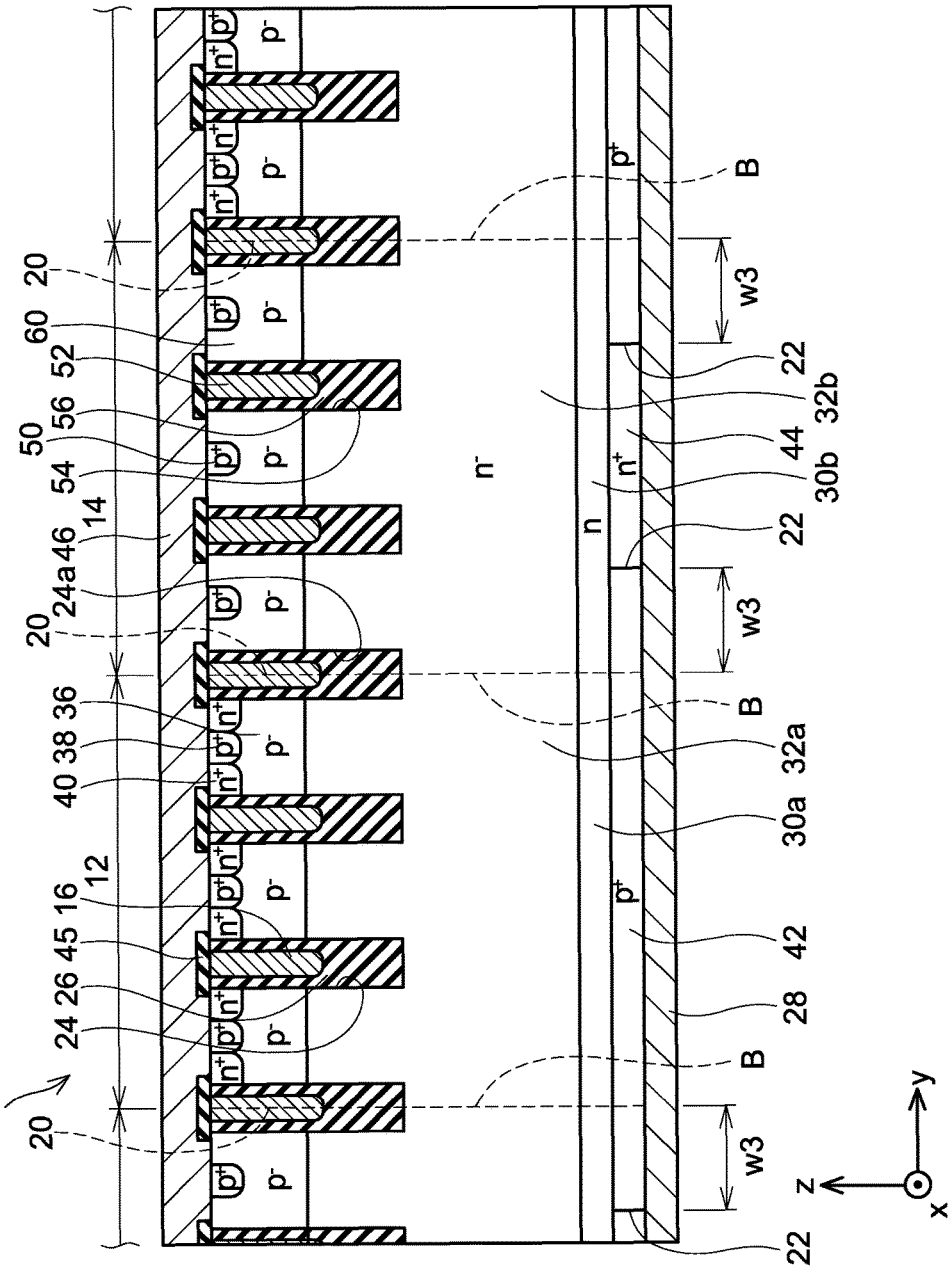
FIG. 7 is a longitudinal sectional view of a semiconductor device according to a Third Embodiment.

Next, a Third Embodiment will be described with reference to FIG. 7. A semiconductor device 210 according to the Third Embodiment differs from the semiconductor device 10 according to the First Embodiment in that the width of each IGBT region 12 and the width of each diode region 14 are equal to each other and that back surface side boundary planes 22 are projected from the front surface side boundary planes 20 in a direction from each collector region 42 toward the corresponding cathode regions 44 by a width w3. It should be noted that the width w3 corresponds to one example of the "third predetermined width".

In general, in a case where the width of an IGBT region and the width of a diode region are equal, a loss of Von is larger than a loss of Vf. The aforementioned configuration reduces the interference of a diode with an IGBT on a boundary plane between the IGBT and the diode, thus decreasing the loss of Von. At this occasion, the loss of Vf increases on the contrary, but the amount of decrease in the loss of Von exceeds the amount of increase in the loss of Vf. As a result, the sum of the losses of Von and Vf can be reduced.

As shown in the First to Third Embodiments, the projecting widths w1 to w3 of each cathode region 44 or each collector region 42 at which the loss of the semiconductor device (i.e., the sum of losses of Von and Vf) is smallest vary depending on, for example, the ratio of the area of each IGBT region 12 to the area of each diode region 14 (i.e., the ratio of the width of the IGBT region 12 to the width of the diode region 14), the values of the areas of the IGBT region 12 and the diode region 14, and the thickness of the semiconductor substrate. The shift of the back surface side boundary planes 22 from the front surface side boundary planes 20 by a length of the projection widths w1 to w3 can reduce the interference of one of the IGBT and the diode with the other. At this occasion, the interference of the other with the one increases on the contrary. That is, there is a trade-off between the loss due to Von and the loss due to Vf. The present inventors found that the shift of the back surface side boundary planes 22 from the respective front surface side boundary planes 20 causes the loss of Von and the loss of Vf to increase or decrease by different amounts of change. The technology disclosed herein utilizes this finding, and makes it possible to easily reduce the loss of a semiconductor device simply by changing the width of each cathode region 44 or each collector region 42.

Fourth Embodiment

Figure 8:
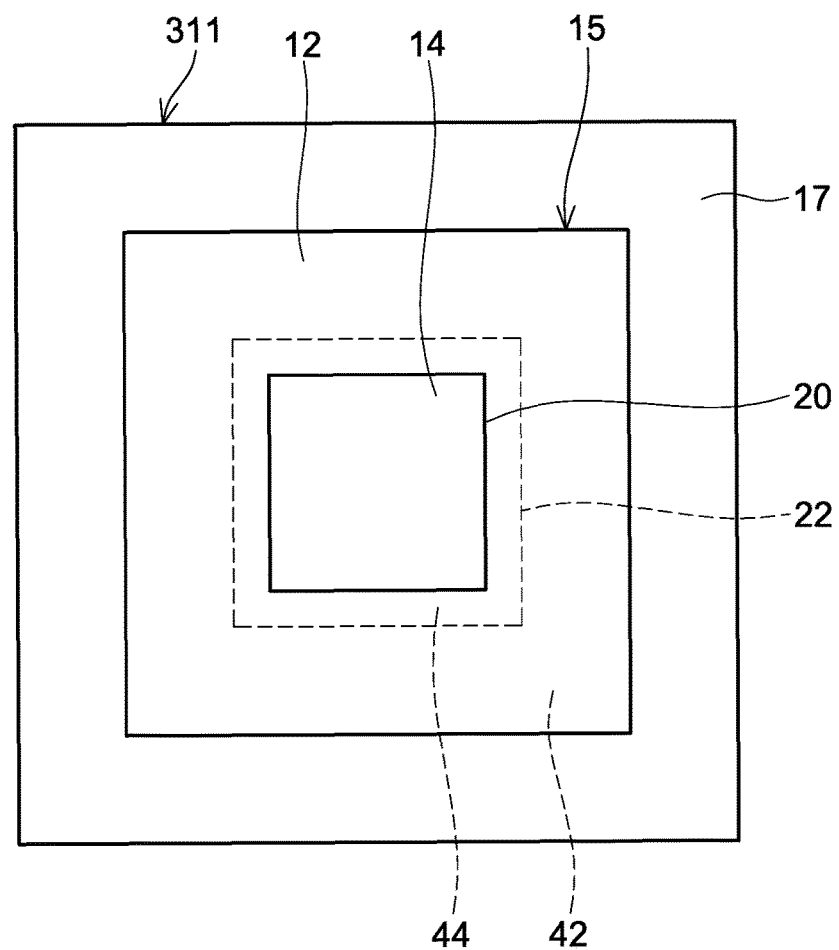
FIG. 8 is a plan view of a semiconductor substrate according to a Fourth Embodiment.

Next, a Fourth Embodiment will be described with reference to FIG. 8. In a semiconductor substrate 311 according to the Fourth Embodiment, an element region 15 and a non-element region 17 surrounding the element region 15 are provided. In the element region 15, an IGBT region 12 and a diode region 14 are provided. The IGBT region 12 surrounds an outer periphery of the diode region 14, and the IGBT region 12 and the diode region 14 are adjacent to each other. The IGBT region 12 has a larger area than the diode region 14. A boundary between the IGBT region 12 and the diode region 14 on a front surface side of the semiconductor substrate 311 is a front surface side boundary plane 20. Meanwhile, a collector region 42 and a cathode region 44 are provided on a back surface of the semiconductor substrate 311. The collector region 42 surrounds an outer periphery of the cathode region 44. Dashed lines indicate the position of a back surface side boundary plane 22. As shown in FIG. 8, the back surface side boundary plane 22 is located within the IGBT region 12. It should be noted that in the Fourth Embodiment, the collector region 42 has its outer peripheral edge located in the same position as a boundary plane of an outer peripheral side of the IGBT region 12 (i.e., an outer peripheral edge of the element region 15) in a plan view of the semiconductor substrate 311.

In the Fourth Embodiment, the area of the IGBT region 12 is larger than the area of the diode region 14. In this case, the back surface side boundary plane 22 is shifted from the front surface side boundary plane 20 in directions from the cathode region 44 toward the collector region 42. This configuration brings about the same effects as the First Embodiment.

In the foregoing description, embodiments of the technology disclosed herein have been described in detail. However, these embodiments are merely examples. Semiconductor devices disclosed herein encompass various modifications and variations of the foregoing embodiments. For example, the technology disclosed herein may be applied to a combination of semiconductor elements other than a combination of an IGBT and a diode. Further, no trench may not have to be provided in any diode region 14. Further, although the foregoing embodiments assume that the first conductivity type is an n type and the second conductivity type is a p type, this does not imply any limitation. The first conductivity type may be a p type, and the second conductivity type may be an n type.

While embodiments of the present invention have been described above in detail, these embodiments are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

The invention claimed is:

1. A semiconductor device comprising a semiconductor substrate in which at least one IGBT region and at least one diode region are provided, wherein
    the IGBT region comprises:
    a first conductivity type emitter region disposed in an area exposed on a front surface of the semiconductor substrate;
    a second conductivity type base region surrounding the emitter region and in contact with the emitter region;
    a first conductivity type first drift region disposed on a back surface side of the semiconductor substrate with respect to the base region, and being separated from the emitter region by the base region;
    a gate electrode disposed in a trench penetrating the base region to extend to the first drift region, and facing a part of the base region which separates the emitter region from the first drift region;
    an insulating body disposed between the gate electrode and an inner wall of the trench; and
    a second conductivity type collector region disposed in an area exposed on a back surface of the semiconductor substrate,
    the diode region comprises:
    a second conductivity type anode region disposed in an area exposed on the front surface of the semiconductor substrate;
    a first conductivity type second drift region disposed on the back surface side of the semiconductor substrate with respect to the anode region; and
    a first conductivity type cathode region disposed in an area exposed on the back surface of the semiconductor substrate;
    the IGBT region and the diode region are adjacent to each other in a plan view of the semiconductor substrate,
    the emitter region does not exist in the diode region,
    in the plan view of the semiconductor substrate, an area of a structure on a front surface side of the IGBT region is larger than an area of a structure on a front surface side of the diode region, a first boundary plane where the collector region and the cathode region are adjacent is shifted from a second boundary plane where the IGBT region and the diode region are adjacent on the front surface side of the semiconductor substrate in a direction from the cathode region toward the collector region, and a third boundary plane at at an edge of the IGBT region opposite the second boundary plane on the front surface side of the semiconductor substrate in a direction from the fourth boundary plane toward the first boundary plane.

2. The semiconductor device according to claim 1, wherein
    the diode region includes a first diode region, a second diode region, and a third diode region, the first diode region, the second diode region, and the third diode region being separated from each other,
    the IGBT region includes:
    a first IGBT region provided between the first diode region and the second diode region; and
    a second IGBT region provided between the second diode region and the third diode region,
    the first diode region, the first IGBT region, the second diode region, the second IGBT region, and the third diode region are aligned in a first direction,
    in the plan view of the semiconductor substrate, each of a width of a structure on a front surface side of the first IGBT region in the first direction and a width of a structure on a front surface side of the second IGBT region in the first direction is wider than a width of the structure on the front surface side of the second diode region in the first direction,
    the first boundary plane is between the collector region of the first IGBT region and the cathode region of the one of the second diode region and the second boundary plane is between the first IGBT region and the second diode region on the front surface side of the semiconductor substrate,
    the third boundary plane is between the collector region of the first IGBT region and the cathode region of the first diode region and the fourth boundary plane is between the first IGBT region and the first diode region on the front surface side of the semiconductor substrate, and
    a fifth boundary plane between the collector region of the second IGBT region and the cathode region of the second diode region is shifted from a sixth boundary plane between the second IGBT region and the second diode region on the front surface side of the semiconductor substrate in a direction from the cathode region of the second diode region toward the collector region of the second IGBT region.

3. The semiconductor device according to claim 1, wherein
    in the plan view of the semiconductor substrate, the IGBT region and the diode region have rectangular shapes,
    the IGBT region and the diode region are adjacent to each other in a predetermined direction,
    the first boundary plane and the second boundary plane extend in a direction perpendicular to the predetermined direction,
    a width of the structure on the front surface side of the IGBT region in the predetermined direction is wider than a width of the structure on the front surface side of the diode region in the predetermined direction, and the first boundary plane is shifted from the second boundary plane in the direction from the cathode region toward the collector region by a first predetermined width.

4. The semiconductor device according to claim 3, wherein
a ratio of the width of the structure on the front surface side of the IGBT region to the width of the structure on the front surface side of the diode region in the predetermined direction is 3 to 1, the first boundary plane is shifted from the second boundary plane in the direction from the cathode region toward the collector region by a length of 3 to 30% of the width of the structure on the front surface side of the diode region.

* * * * *